United States Patent [19]

Noguchi

[11] 4,031,471

[45] June 21, 1977

[54] AUTOMATIC FREQUENCY CONTROL CIRCUIT

[75] Inventor: Toshitake Noguchi, Tokyo, Japan

[73] Assignee: Nippon Electric Co., Ltd., Tokyo, Japan

[22] Filed: Dec. 17, 1975

[21] Appl. No.: 641,709

[30] Foreign Application Priority Data

Dec. 18, 1974 Japan ............................ 49-145156

[52] U.S. Cl. .............................. 325/423; 325/420; 325/4; 331/1 A
[51] Int. Cl.² .......................................... H04B 1/16
[58] Field of Search .......... 325/418, 419, 420, 421, 325/423, 3, 4; 329/122, 123, 124; 331/1 A; 179/15 BS, 68.1

[56] References Cited

UNITED STATES PATENTS

| | | | |
|---|---|---|---|
| 2,915,626 | 12/1959 | Freedman | 325/423 |
| 2,988,637 | 6/1961 | Vandgraaf | 325/420 |
| 3,238,460 | 3/1966 | Enloe | 325/419 |
| 3,479,600 | 11/1969 | Miller | 325/423 |
| 3,824,474 | 7/1974 | Sakamoto | 325/420 |

*Primary Examiner*—Robert L. Griffin
*Assistant Examiner*—Tommy P. Chin
*Attorney, Agent, or Firm*—Sughrue, Rothwell, Mion, Zinn & Macpeak

[57] ABSTRACT

An automatic frequency control circuit is disclosed which is capable of noise suppression and sufficiently reducing the frequency deviation or offset of an input signal at an output, regardless of the variation of the burst width of the input burst signal in a time-division multiplex communication system. The automatic frequency control circuit comprises a frequency converter for the frequency conversion of an input signal, a bandpass filter connected to the output of said frequency converter, first and second phase comparators of mutually different output characteristics adapted to compare phases of input and output signals of said bandpass filter, first and second holding circuits for holding the maximum voltages of output signals of said first and second phase comparators, respectively, an arithmetic circuit for calculating output signals of said first and second holding circuits, and a voltage-controlled oscillator responsive to an output signal fo said arithmetic circuit and connected to said frequency converter. In this circuit, owing to the fact that an additional phase comparator, two holding circuits and an arithmetic circuit are added to the conventional circuit, the output signals of the holding circuits, which hold maximum voltages corresponding to the maximum and minimum values, respectively, of the input burst signal frequency, are calculated by the arithmetic circuit and then the result of the calculation is applied to the voltage-controlled oscillator (VCO). This input to the VCO is virtually a D.C. control signal to provide a local oscillation having a frequency differing by a fixed frequency from the average frequency of the maximum and minimum frequencies of the input burst signal. Accordingly, regardless of the variation of the burst width of the input burst signal, the output frequency of the VCO is maintained at a frequency having a fixed frequency difference from the average frequency of the maximum and minimum frequencies of the input burst signal.

6 Claims, 8 Drawing Figures

AUTOMATIC FREQUENCY CONTROL CIRCUIT

BACKGROUND OF THE INVENTION

The present invention relates to an automatic frequency control circuit and, more particularly, to an automatic frequency control circuit in a receiver of time-division multiplex communication system.

An automatic frequency control circuit (AFC) in the prior art is constructed of a frequency converter for the frequency conversion of an input signal, a narrow-band filter connected to an output of said frequency converter, a phase comparator for comparing phases of input and output signals of said narrow-band filter and deriving at an output a voltage proportional to a phase difference between said input and output signals, and a voltage-controlled oscillator (VCO) supplied with the output of said phase comparator via a low-pass filter for delivering an output coupled to another input of said frequency converter. In such an AFC circuit, an input signal having a frequency offset is applied to the frequency converter to be mixed with the output of the voltage-controlled oscillator. The frequency of the output of the frequency converter is either a sum of or a difference between the frequency of the input signal and that of the output of the voltage-controlled oscillator. It is assumed here that the difference frequency is utilized in the system. The thus derived signal is applied to the narrow-band filter. A signal proportional to the phase difference between the input and the output signals of the narrow-band filter is derived from the phase comparator. This output signal is applied to the voltage-controlled oscillator via the low-pass filter, and thereby the voltage-controlled oscillator is controlled so that it may oscillate at a frequency having a fixed frequency difference with respect to the input signal.

If the input signal is incoming continuously as in the prior art, then the conventional AFC circuit fully achieves its function. However, in the case of the time-division multiplex satellite communication system in which a plurality of stations are linked on a time-division basis employing substantially equal frequencies, the modulated wave signals of the respective stations are received as intermittent signals, that is, as burst mode signals. In this case, if the AFC circuit is intended to respond to each burst from each station by employing the conventional circuit, then the cut-off frequency of the low-pass filter must be set to be high to shorten the response time of the AFC circuit. However, with such a cut-off frequency setting, thermal noise and other disturbances cannot be suppressed, so that the voltage-controlled oscillator is adversely affected. On the other hand, if the low-pass filter is given a low cut-off frequency, the AFC circuit cannot be fully responsive to a short burst signal even through it may be to a longer one.

SUMMARY OF THE INVENTION

One object of the present invention is therefore to provide an automatic frequency control circuit capable of noise suppression and sufficiently reducing the frequency deviation of an input signal at an output, regardless of the variation of the burst width of the input burst signal in a time-division multiplex communication system.

According to the present invention there is provided an automatic frequency control circuit comprising a frequency converter for the frequency conversion of an input signal, a band-pass filter connected to the output of said frequency converter, first and second phase comparators of mutually different output characteristics adapted to compare phases of input and output signals of said band-pass filter, first and second holding circuits for holding the maximum voltages of output signals of said first and second phase comparators, respectively, an arithmetic circuit for calculating output signals of said first and second holding circuits, and a voltage-controlled oscillator responsive to an output signal of said arithmetic circuit and connected to said frequency converter. In this circuit, owing to the fact that an additional phase comparator, two holding circuits and an arithmetic circuit are added to the conventional circuit, the output signals of the holding circuits, which hold maximum voltages corresponding to the maximum and minimum values, respectively, of the input burst signal frequency, are calculated by the arithmetic circuit and then the result of the calculation is applied to the voltage-controlled oscillator (VCO). This input to the VCO is virtually a D.C. control signal to provide a local oscillation having a frequency differing by a fixed frequency from the average frequency of the maximum and minimum frequencies of the input burst signal. Accordingly, regardless of the variation of the burst width of the input burst signal, the output frequency of the VCO is maintained at a frequency having a fixed frequency difference from the average frequency of the maximum and minimum frequencies of the input burst signal. It is to be noted that the AFC circuit according to the present invention can achieve its effects if the frequency difference between stations (hereinafter referred to as "relative frequency offset") is smaller than the offset of the absolute value of frequency of each station from its reference frequency (hereinafter referred to as "absolute frequency offset").

BRIEF DESCRITPION OF THE DRAWINGS

Now the present invention will be described in more detail with reference to the accompanying drawings, in which.

DESCRITPION OF THE PREFERRED EMBODIMENT

Figure 1:
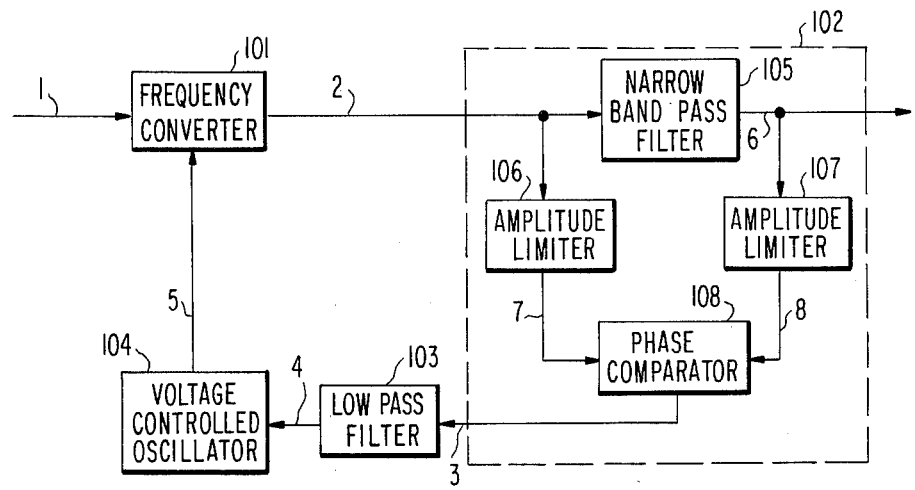
FIG. 1 is a block diagram of one example of the conventional automatic frequency control circuits.
Figure 2:
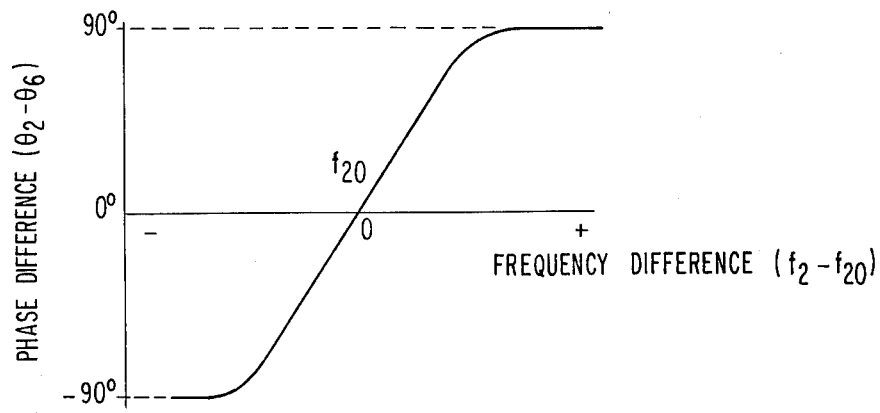
FIG. 2 is a diagram showing a relation between the frequency difference and the phase difference observed at the narrow-band filter.

Referring now to the drawings, one example of the conventional AFC circuits is shown in FIG. 1. An input signal 1 is applied to a frequency converter 101 and mixed with an output signal 5 of a voltage-controlled oscillator VCO (or a local oscillator) 104. It is to be noted here that the input signal 1 does not always contain an unmodulated carrier wave because the input signal 1 is generally a modulated wave. However, considering the case of, for example, an N-phase (N is integer equal to or larger than 2) PSK modulated wave, then it can be transformed into an unmodulated signal by passing through an N-multiplier circuit. While if an unmodulated component is contained, it can be extracted through a narrow-band bandpass filter. Therefore, we can assume here without losing generality that the input signal is a signal already transformed into an unmodulated signal although it contains thermal noise and a residual modulation component of the modulated signal. A frequency $f2$ of an output signal 2 of the frequency converter 101 is either a sum of or a difference between a frequency $f1$ of the input signal 1 and the frequency of the VCO output signal 5, but here it is assumed that the difference frequency is the output frequency $f2$. Even if assumed so, generality of the following description is not lost, because a similar description can be made with respect to the sum component. The thus derived signal 2 is applied to a frequency discriminator 102, in which an output signal 3 proportional to the difference from a nominal frequency $f20$ can be derived. The frequency discriminator 102 is composed of a narrow-band bandpass filter 105, amplitude limiters 106 and 107, and a phase comparator 108. The output signal 2 of the frequency converter 101 is applied to the narrow-band filter 105 and the amplitude limiter 106. It is to be noted that the amplitude limiters 106 and 107 may be omitted, because they are provided for the purpose of suppressing the variation of amplitude and thus they are not essential for the frequency discriminator. The phase difference between the input and output of the narrow-band filter 105 has a predetermined relation to the frequency of the signal. By way of example, the relation is illustrated in FIG. 2 with respect to the case where a single resonant circuit is used. More particularly, if the frequency of the signal 2 is represented by $f2$, the phase of the same $\theta_2$, the phase of the signal 6 by $\theta_6$ and the resonant frequency of the single resonant circuit by $f20$, then $\theta_2 - \theta_6$ and $f2 - f20$ are correlated as shown in FIG. 2. In this figure, when the frequency $f2$ is in the neighborhood of the frequency $f20$, $\theta_2 - \theta_6$ would vary in proportion to $f2 - f20$. Assuming that the relation illustrated in FIG. 2 is not varied by the amplitude limiters 106 and 107, a voltage signal 3 proportional to $f2 - f20$ can be obtained by applying the output signals 7 and 8 of the amplitude limiters 106 and 107, respectively, to the phase comparator 108 to transform their phase difference $\theta_2 - \theta_6$ into a voltage. An output signal 5 of the VCO 104 which is controlled by this output signal 3 is applied to the frequency converter 101, and thereby the frequency of the output signal 2 is made to coincide with the nominal frequency $f20$. In connection with the above description, although the VCO 104 can include a frequency multiplier at its output, the circuit 104 may be constructed as a simple-voltage-controlled oscillator without losing its generality.

Figure 3:
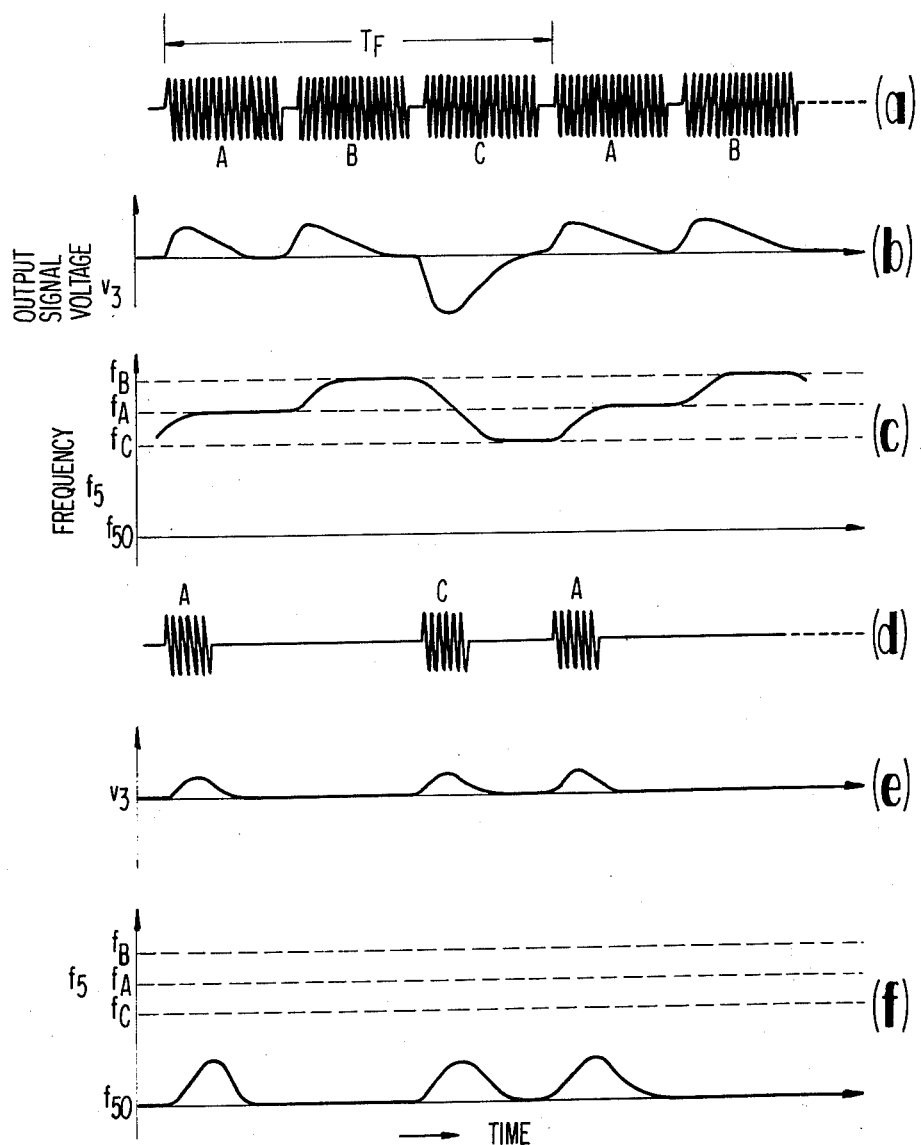
FIG. 3 is a diagram showing one example of the input signal train and the corresponding response waveforms observed at various portions.

In the time-division multiplex satellite communication system or the like, a modulated wave signal is received at each station in the form of an intermittent signal, that is, a burst mode signal. A representative timing diagram for this system is illustrated in FIG. 3. With reference to FIG. 3($a$), modulated waves from three stations A, B and C are respectively received during a predetermined time interval $T_F$ so that they may not overlap with each other along the time axis. In general, the carrier frequencies of the respective modulation waves from the three stations A, B and C are different from each other. However, in contrast to the relative frequency offset being caused by the frequency offset arising at the transmitting end of each station, the absolute frequency offset includes a frequency offset arising after the inter-station signals have been synthesized such as, for example, Doppler offset and frequency offsets of receiving local oscillators, and therefore, normally the absolute frequency offset is larger than the relative frequency offset. In FIGS. 3($b$) and 3($c$) are respectively shown the relations between the voltage V3 of the output signal 3 and the frequency $f5$ of the output signal 5, corresponding to the frequencies $fA$, $fB$ and $fC$ of the respective stations. If the cut-off frequency of the low-pass filter 103 is high as illustrated in these figures, then the filter 103 can respond to the frequency of the input burst signal, but it cannot suppress the thermal noise and other disturbances so that it adversely affects the VCO 104. On the other hand, when the cut-off frequency of the low-pass filter 103 is low, with the burst width of each burst signal being small, then the frequency $f5$ of the output signal 5 cannot sufficiently respond to the input burst signals $fA$ to $fC$ as illustrated in FIGS. 3($d$) to 3($f$).

Figure 4:
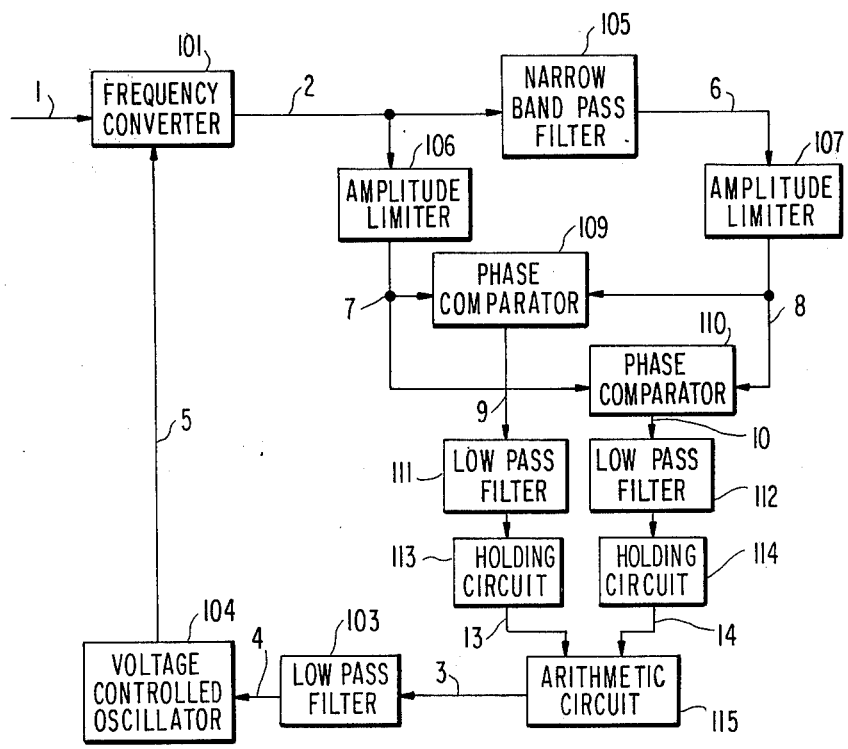
FIG. 4 is a block diagram of the circuit according to the present invention.

One example of the AFC circuit according to the present invention which is free from the aforementioned shortcomings is illustrated in FIG. 4 in a block diagram. Reference numeral 101 designates a frequency converter which emits at its output a signal 2 having a frequency equal to the difference between the carrier frequency of an input signal 1 and the frequency of an output signal 5 of a VCO 104. Reference numeral 105 designates a narrow-band filter, in which the phase difference between its input signal 2 and its output signal 6 and the frequency difference between its input signal frequency and its nominal frequency are correlated as illustrated in FIG. 2. Reference numerals 106 and 107 designate amplitude limiters which suppress the variations in amplitudes of their respective input signals. These limiters are not essential for an AFC circuit and may be dispensed with. Reference numerals 109 and 110 designate phase comparators. Reference numerals 111 and 112 designate low-pass filters for suppressing noises, but these filters can be omitted. Reference numeral 113 designates a holding circuit for holding a maximum voltage of positive polarity of an input signal 11, while reference numeral 114 designates another holding circuit for holding a maximum voltage of negative polarity of an input signal 12. Reference numeral 115 designates an arithmetic circuit for deriving a sum of voltages of input signals 13 and 14, reference numeral 103 designates a low-pass filter for suppressing noise, and reference numeral 104 designates a voltage-controlled oscillator. Here, it is assumed that circuit components represented by the same numerals as those in FIG. 1 have like functions.

Figure 5:
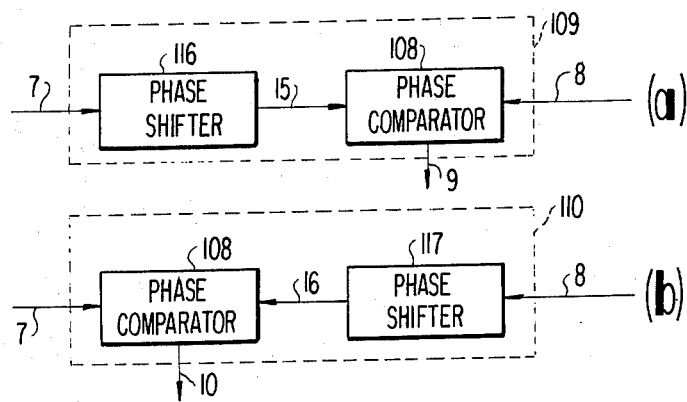
FIG. 5 is a more detailed block diagram of one example of the phase comparator in FIG. 4.
Figure 6:
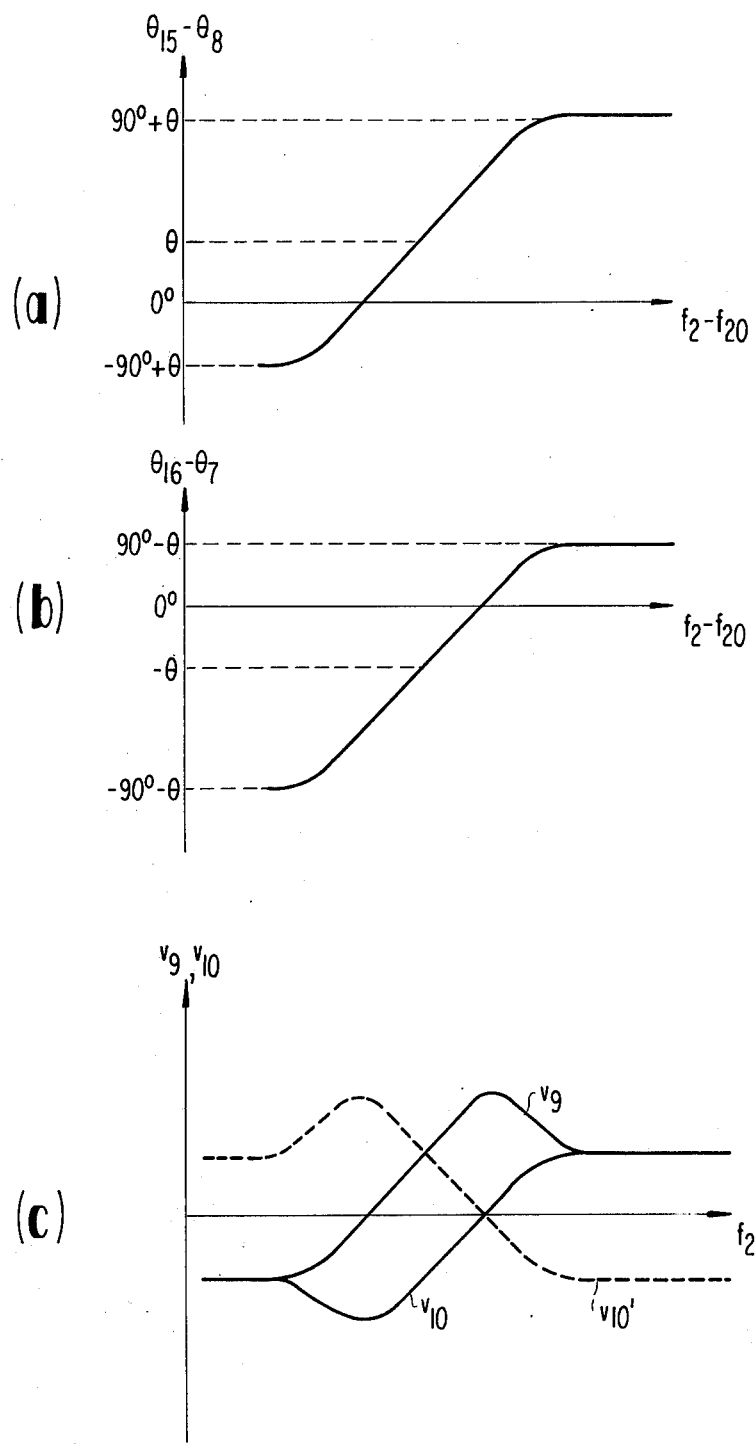
FIG. 6 is a diagram showing phase characteristics and output voltage characteristics with respect to the frequency difference of the phase comparator in FIG. 4.
Figure 7:
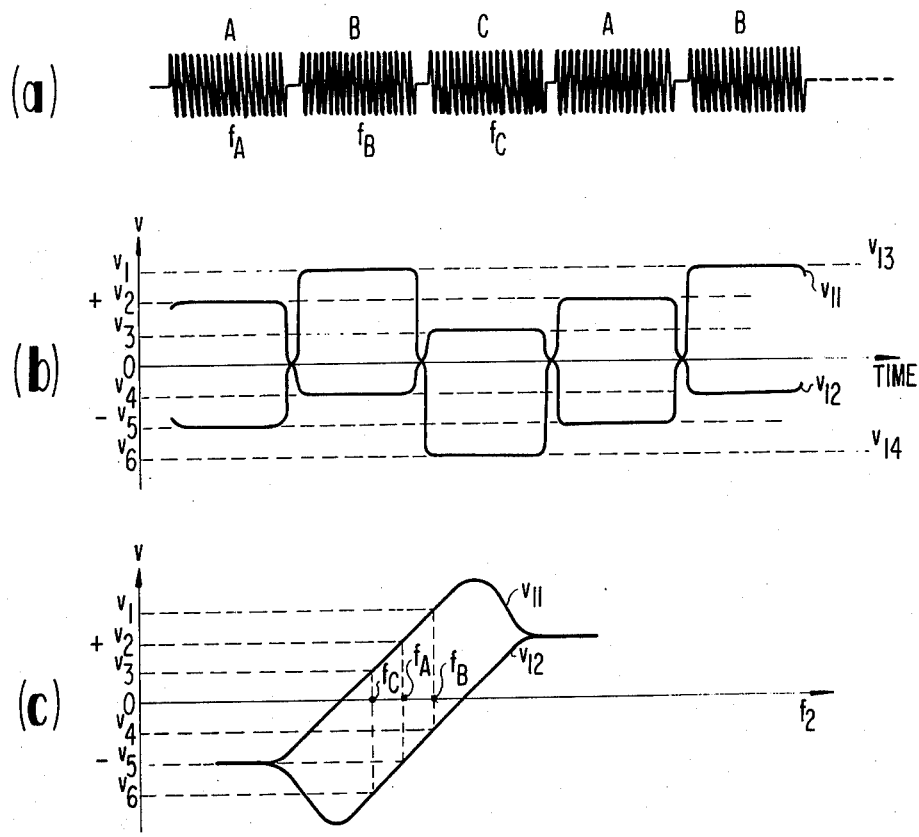
FIG. 7 shows output voltage characteristics of the phase comparator in response to input burst signals.
Figure 8:
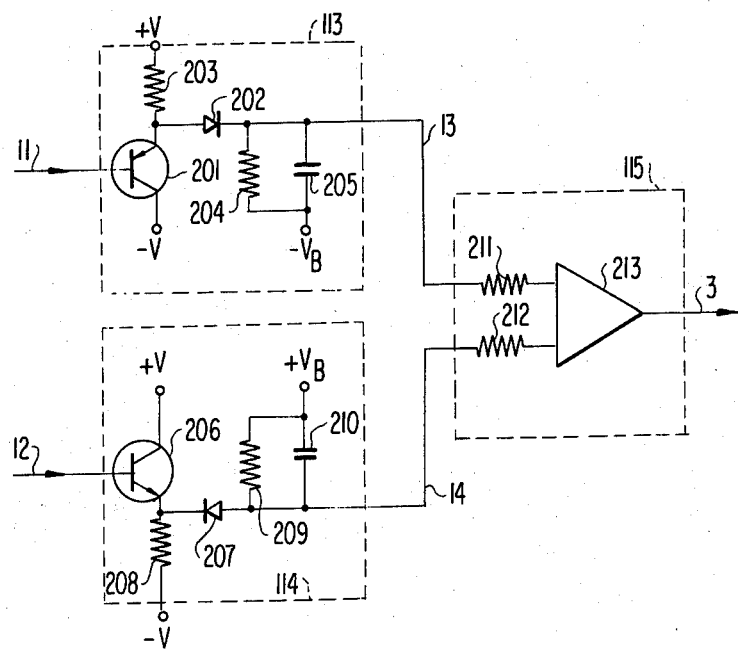
FIG. 8 is a detailed circuit diagram of the holding circuits and the arithmetic circuit in FIG. 4.

Now the operation of the circuit shown in FIG. 4 will be described. The input signal 1 is applied to the frequency converter 101 to be mixed with the output signal 5 of the VCO. The frequency of the output signal 2 of the frequency converter 101 is a difference between the frequency $f1$ of the input signal 1 and the frequency $f5$ of the signal 5, and this difference frequency is represented by $f2$. The signal 2 is applied to the narrow-band filter 105 and the amplitude limiter 106. An output signal of the narrow-band filter 105 is applied to the other amplitude limiter 107. Output signals of the amplitude limiters 106 and 107 are applied to phase comparators 109 and 110, respectively. More detailed block diagrams of the phase comparators 109 and 110 are respectively shown at (a) and (b) in FIG. 5. With reference to FIG. 5, after the signal 7 (or the signal 8) has been phase-shifted by a phase angle $\theta$ in a phase shifter 116 (or a phase shifter 117), the signal is applied to a phase comparator 108 that is similar to the conventional phase comparator in FIG. 1. Since the characteristics of the narrow-band filter 105 are the same as those of the conventional one illustrated in FIG. 2, the relation of the phase difference between the signals 15 and 8 or between the signals 7 and 16 ($\theta_{15} - \theta_8$ or $\theta_{16} - \theta_7$) versus the frequency difference $f2 - f20$ is as shown at (a) or (b) in FIG. 6. Accordingly, where the phase comparator 108 has characteristics of $$V = \sin\Delta\theta,$$

when $\Delta\theta = \theta_{15} - \theta_8$ or $\theta_{16} - \theta_7$ and V represents an output voltage, the relation between the output voltages V9 and V10 of the phase comparators 109 and 110 and the frequency difference $f2 - f20$ is as shown at (c) in FIG. 6. These output signals 9 and 10 are applied to low-pass filters 111 and 112, repectively. These low-pass filters 111 and 112 are given at such frequency bands that the output may sufficiently rise in response to the input signal for a given length of burst and that disturbances caused by noise and the like may be suppressed to a certain extent. Output signals 11 and 12 of the low-pass filters 111 and 112 are applied to a positive maximum voltage holding circuit 113 and a negative maximum voltage holding circuit 114, respectively. At (c) in FIG. 7 are shown output voltages V11 and V12 of the signals 11 and 12 in response to the frequency $f2$ when input burst signals (having frequencies $fA$, $fB$ and $fC$) from the stations A, B and C as shown at (a) in FIG. 7 have arrived. One practical example of the holding circuits 113 and 114 for holding these output voltages V11 and V12 and the arithmetic circuit 115 for calculating their output signals 13, and 14, is shown in FIG. 8. The positive (or negative) maximum voltage holding circuit 113 (or 114) is composed of a transistor 201 (or 206), resistors 203, 204 (or 208, 209), a diode 202 (or 207), and a capacitor 205 (or 210). The transistor 201 (or 206) is turned conductive by the positive (or negative) maximum voltage of the signal 11 (or 12), so that an electric charge can be accumulated in the capacitor 205 (or 210) through the diode 202 (or 207). In other words, in the capacitors 205 and 210 are accumulated electric charges corresponding to the voltages V1 and V6, respectively, as indicated at (b) in FIG. 7. Apparently, these voltages correspond to the maximum frequency and the minimum frequency, respectively, among the three stations A, B and C, and it is obvious that these correlations are not varied even if the number of stations in increased or the transmission periods of the respective stations are varied. These voltage signals 13 and 14 are added by the arithmetic circuit (in this case, an adding circuit) composed of an adder 213 and resistors 211 and 212, and thereby transformed into their average voltage signal 3. Since the signal 3 is a signal substantially approximate to a D.C. signal, the low-pass filter 103 provided for the purpose of suppressing the noise in the subsequent stages can be made sufficiently narrow regardless of the mode of the time-division signal. Otherwise, by appropriately selecting the time constants of the capacitor 205 and resistor 204 in the holding circuit 113 and the capacitor 210 and resistor 209 in the holding circuit 114, the low-pass filter can be omitted. The derived voltage signal 4 is a voltage signal corresponding to the deviation of the average value of the maximum and minimum input signal frequencies with respect to the resonant frequency of the narrow-band filter 105. The signal 4 is negatively fed back to the VCO 104. With regard to the characteristics as an AFC loop, the aforementioned circuit is similar to the conventional AFC circuits except for the facts that the control signal is transformed substantially into a D.C. signal and that the circuit operates in response to the maximum and minimum frequencies of the input signal, and therefore, this circuit incorporates the characteristics of AFC circuits. While the arithmetic circuit 115 above has been described as an adding circuit, in an alternative embodiment the output of the phase comparator 110 is inverted so that a characteristic curve as shown by a dotted line V10, at (c) in FIG. 6 may be obtained. Then, the holding circuit 114 is modified so as to hold a positive maximum voltage. In this case it is only necessary to modify the arithmetic circuit 115 so as to subtract the output signal of the holding circuit 114 from that of the holding circuit 113.

As described above, in the automatic frequency control circuit according to the present invention, the output of the arithmetic circuit is transformed substantially into a virtually D.C. signal, so that when the AFC circuit is employed in a time-division multiplex communication system it can stably control the frequency independently of the transmission time width from each station.

I claim:

1. An automatic frequency control circuit for use in a time-division multiplex communication system including a frequency converter for receiving an input signal and a local oscillator signal and producing an output signal which is the sum or difference of said input and local oscillator signals, and a voltage-controlled oscillator for generating said local oscillator signal in response to a control voltage, said automatic frequency control circuit comprising:
 a band-pass filter connected to the output of said frequency converter,
 first and second phase comparator means each having a first input connected to the output of said frequency converter and a second input connected to the output of said band-pass filter for comparing the phases of the input and output signals of said band-pass filter, said first and second phase comparator means having different output characteristics,
 first and second holding circuits for holding the maximum voltages of output signals of said first and second phase comparators, respectively, and
 an arithmetic circuit for calculating the average value of the output signals of said first and second holding circuits to develop said control voltage.

2. The automatic frequency control circuit as recited in claim 1 wherein said first and second phase comparator means each comprise a phase comparator and a phase shifter connected to one input of said phase comparator, the phase shifter of said first phase comparator means and the other input of the phase comparator of said second phase comparator means being connected to receive the output of said frequency converter while the phase shifter of said second phase comparator means and the other input of the phase comparator of said first phase comparator means are connected to the output of said band-pass filter.

3. The automatic frequency control circuit as recited in claim 2 wherein said first holding circuit holds the maximum positive output voltage signal of said first phase comparator means, said second holding circuit holds the maximum negative output voltage signal of said second phase comparator means, and said arithmetic circuit is a summing amplifier.

4. The automatic frequency control circuit as recited in claim 2 further comprising a first amplitude limiter connected between the output of said frequency converter and the first inputs of said first and second phase comparator means, and a second amplitude limiter connected between the output of said band-pass filter and the second inputs of said first and second phase comparator means.

5. The automatic frequency control circuit as recited in claim 2 further comprising a first low-pass filter connected between the output of said first phase comparator means and the input of said first holding circuit, and a second low-pass filter connected between the output of said second phase comparator means and the input of said second holding circuit.

6. The automatic frequency control circuit as recited in claim 5 further comprising a third low-pass filter connected between the output of said arithmetic circuit and the control input of said voltage-controlled oscillator.

* * * * *